United States Patent [19]
Fujii et al.

[11] Patent Number: 6,101,078
[45] Date of Patent: Aug. 8, 2000

[54] SEMICONDUCTOR DEVICE WITH PROTECTION CIRCUIT

[75] Inventors: Takeo Fujii; Kaoru Narita; Yoko Horiguchi, all of Tokyo, Japan

[73] Assignee: NEC Corporation, Tokyo, Japan

[21] Appl. No.: 09/149,112

[22] Filed: Sep. 9, 1998

[30] Foreign Application Priority Data

Sep. 12, 1997 [JP] Japan ................................. 9-248082

[51] Int. Cl.⁷ ........................................................ H02H 3/00
[52] U.S. Cl. ............................... 361/111; 361/56; 361/58; 361/118
[58] Field of Search ............................... 361/56, 58, 91.1, 361/111, 115, 118, 119

[56] References Cited

U.S. PATENT DOCUMENTS 5,869,870  2/1999  Lin ........................................... 257/355

FOREIGN PATENT DOCUMENTS

| 61-180470 | 8/1986 | Japan | H01L 27/06 |
| 63-3463 | 1/1988 | Japan | H01L 23/48 |
| 2-119171 | 5/1990 | Japan | H01L 23/60 |
| 6-120426 | 4/1994 | Japan | H01L 27/04 |

*Primary Examiner*—Stephen W. Jackson
*Attorney, Agent, or Firm*—Young & Thompson

[57] ABSTRACT

A lead on chip (LOC) semiconductor device or a chip on lead (COL) semiconductor device with a protection circuit. Non-connection pins are made shorter than connection pins to reduce the inductance of the non-connection pins, or to obtain a different capability of the protection circuit for non-connection pins with respect to connection pins. The time constant of the protection circuit for the non-connection pins is made longer than that of the protection circuit for the connection pins. Further, the clamping capability for the connection pins is made greater than that for another connection pin adjacent to the connection pin.

27 Claims, 6 Drawing Sheets

SEMICONDUCTOR DEVICE WITH PROTECTION CIRCUIT

BACKGROUND OF THE INVENTION

1. Technical Field of the Invention

The present invention relates to a semiconductor integrated circuit with non-connection pins which are defined neither as an input/output nor as a voltage source.

2. Description of the Prior Art

Generally, the lead on chip (LOC) semiconductor device or chip on lead (COL) semiconductor device is supplied with the defined connection pins connected with input circuit, output circuit, and voltage source circuit, as well as the above-mentioned non-connection pins. Such non-connection pins are inevitably provided particularly in case of gate arrays to choose connections freely.

Further, LOC or COL semiconductor devices are supported on the lead frame which comprises connection pins and non-connection pins for wire bonding. Accordingly, the connection pins and the non-connection pins are extended to the positions for supporting the semiconductor chip.

Therefore, the non-connection pins are adjacent to the connection pins in the semiconductor device packaged by using the above-mentioned lead frame, wherein the non-connection pins are connected with the leads, extending on or under the semiconductor chip through an insulating film, which are not connected electrically with the internal circuit, while the connection pins are connected with the internal circuit electrically by the metal wires bonded with the lead.

If an abnormally high voltage is applied to the non-connection pins by static electricity, the insulating film in the semiconductor chip may suffer electrostatic breakdown by the discharge through the lead.

A semiconductor integrated circuit for preventing the electrostatic breakdown in the non-connection pins is disclosed in the Japanese Patent 61-180470(A) (1986) (Reference 1), wherein a surge voltage discharge circuit is connected to the lead which is connected to the non-connection pins.

There is also disclosed in the Japanese Patent 2-119171 (A)(1990)(Reference 2) a semiconductor integrated circuit for preventing the electrostatic breakdown in the non-connection pins, wherein a protection means including a diode is connected with the connection line pattern.

Further, there is disclosed in the Japanese Patent 6-120426(A)(1994)(Reference 3) a master slice semiconductor integrated circuit with a protection diode circuit for preventing the electrostatic breakdown in the non-connection pins caused by the high voltage induced by a mutual inductance of the lead frame and the bonding wires, when a high voltage is applied to the connection pins which are adjacent to the non-connection pins.

On the contrary, a lead frame which can not support a semiconductor chip during the wire bonding is disclosed in the Japanese Patent 63-3463 (B2)(1988)(Reference 4), wherein the edges of the non-connection leads are more distant from the chip than the connection leads. Such a lead frame can afford some margin in positioning the lead frame and the semiconductor chip, because the spaces between the edge portions are wide.

As mentioned above, the non-connection pins are connected electrically with protection means to prevent the electrostatic breakdown of the non-connection pins by the electrostatic discharge, as disclosed in the References 1, 2 and 3. However, no consideration is taken with respect to the effect on the connection pins adjacent to the non-connection pins, although the breakdown of the non-connection pins is prevented.

Further, the Reference 4 does not point out any problem which arises in case of LOC or COL semiconductor devices wherein lead edges are connected on a chip, although it discloses a lead frame wherein the leads does not support a chip during wire bonding and the lead edges are not connected with the chip.

According to an experiment by the inventors of the present invention, it was confirmed that some voltages are induced in the connection pins adjacent to the non-connection pins which are supplied with high electrostatic voltages, probably because of the mutual inductance due to the inductances of the leads of the non-connection pins and the leads of the connection pins in the LOC or COL semiconductor devices. The inductance by the non-connection pins is not negligible any more, because the non-connection pins are long.

Further, it was found that the voltage induced on the connection pin is very high at the rise-up of the electrostatic voltage applied to the non-connection pin and then, decays rapidly and that this phenomenon results in the breakdown not only in the non-connection pins, but also in the internal circuit connected with the connection pins, for example, the insulating film of the gate of a MOSFET.

The electromotive force induced in the connection pin behaves differently from the electrostatic voltage applied to the non-connection pin. Therefore, different protection circuits are required for the non-connection pin and for the connection pin. Further, the electrostatic voltage applied to the non-connection pin was found to affect not only the adjacent connection pins, but also the other pins positioned at the opposite side of the connection pins.

SUMMARY OF THE INVENTION

Therefore, an object of the present invention is to provide a semiconductor device, especially LOC or COL semiconductor device, wherein the non-connection pin is protected against the electrostatic breakdown and furthermore, an internal circuit connected with the connection pins is protected against the electrostatic breakdown due to the presence of the mutual inductance between non-connection pins and the adjacent connection pins.

Another object of the present invention is to provide a semiconductor device, wherein the effect of the mutual inductance is suppressed, by controlling the voltage due to the electrostatic voltage applied to the non-connection pins.

Still another object of the present invention is to provide a semiconductor device, wherein the effect on the connection pin is suppressed, by reducing the mutual inductance due to the non-connection pins and the connection pins.

Further object of the present invention is to provide a semiconductor device, wherein the effect of the electrostatic voltage applied to the non-connection pins is suppressed, by increasing the clamping capability of the protection circuit of the connection pin adjacent to the non-connection pin.

Still further object of the present invention is to provide a semiconductor device, wherein the effect upon a plurality of the connection pins adjacent to a non-connection pin is suppressed.

In accordance with the present invention, there is provided a semiconductor device comprising a first protection circuit connected with a non-connection pin, and a second protection circuit connected with a connection pin, wherein the characteristic of the first protection circuit is different from that of the second protection circuit, and an internal circuit connected with the connection pin adjacent to the non-connection pin is protected, when an abnormal voltage is applied to said non-connection pin.

The semiconductor device of the present invention may suppresses the rise-up of voltage of the second protection circuit due to the presence of a mutual inductance, when an abnormally high voltage is applied to the non-connection pins. Preferably, the clamping capability of the second protection means is made higher than that of the first protection means.

Further, the semiconductor device of the present invention may be a lead on chip (LOC) semiconductor device or a chip on lead (COL) semiconductor device with reduced mutual inductance, wherein the materials for said non-connection pins are different from those for said connection pins.

Furthermore, the semiconductor device of the present invention may be a lead on chip (LOC) semiconductor device or a chip on lead (COL) semiconductor device comprising a non-connection pin, a connection pin adjacent to the non-connection pin, and another connection pin adjacent to the connection pin wherein: the characteristic of a protection circuit connected with the connection pin is different from that of another protection circuit connected with the another connection pin so that an internal circuit connected with the connection pin is protected against the electrostatic breakdown, when an abnormal voltage is applied to said non-connection pin.

According to the present invention as explained above, the effect of the electromotive force induced by the non-connection pin upon an internal circuit is suppressed in a LOC semiconductor device with non-connection pins and connection pins.

DETAILED DESCRIPTION OF THE INVENTION

Figure 1:
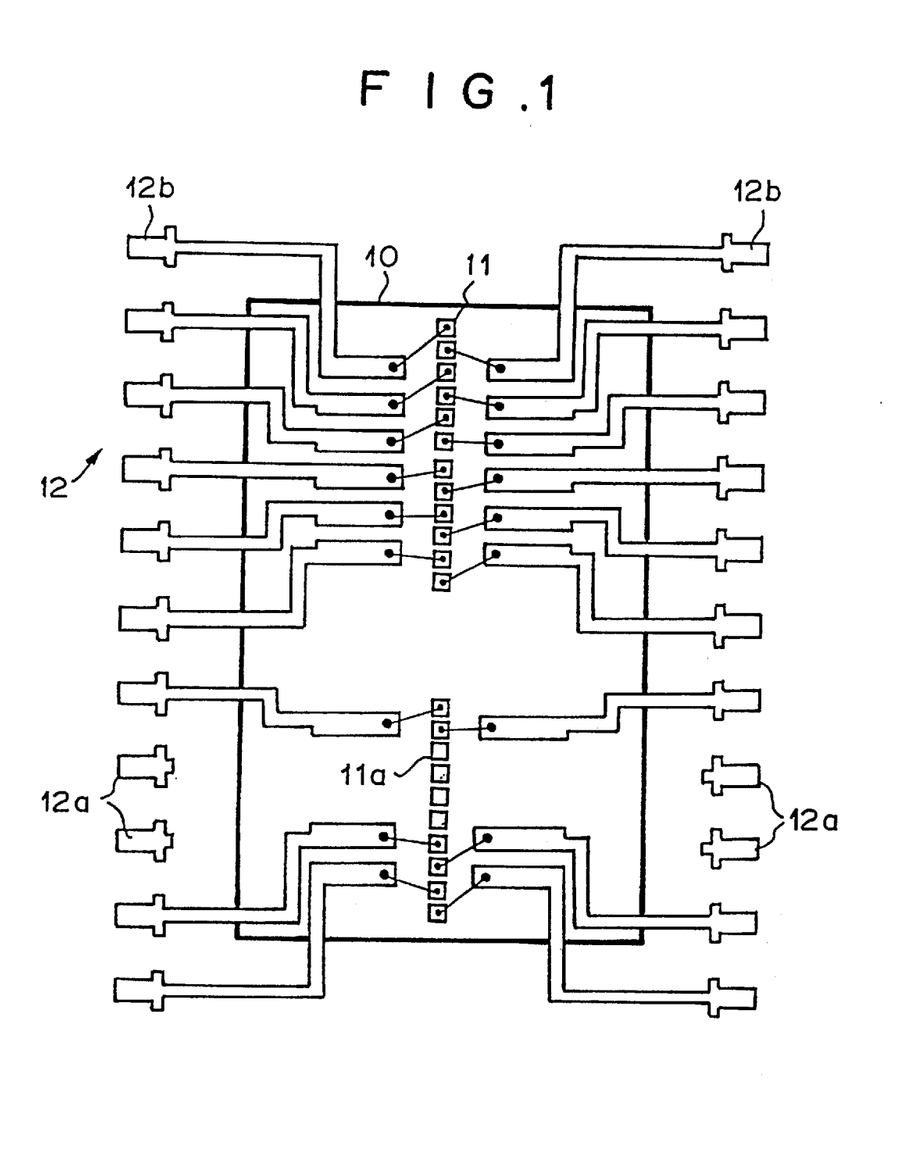
FIG. 1 is a plan view of an arrangement of non-connection pins of the semiconductor device of the present invention.

Referring to the drawings, a preferred embodiment of the present invention is explained. The LOC semiconductor device according to an embodiment of the present invention as shown in FIG. 1 comprises semiconductor chip 10, and a plurality of bonding pads (22 pads of them are illustrated) 11 on semiconductor chip 10, a plurality of pins or lead 12 (22 leads of them are illustrated). The four pads 11a among bonding pads 11 arranged on semiconductor chip 10 are bonding options which are not connected electrically with any lead 12, while the four leads 12a among a plurality of leads 12 is not connected with any bonding pads 11. The rest eighteen leads are connection pins 12b.

As shown in FIG. 1, non-connection pins 12a are not connected electrically with any bonding options 11a, while connection pins 12b are connected electrically with bonding pads 11. Non-connection pins (lead) 12a and connection pins 12b are sealed in a resin package together with semiconductor chip 10.

As shown in FIG. 1, non-connection pins 12a are extremely short, as compared to other connection pins 12b. Accordingly, the inductance by non-connection pins 12a is smaller than the inductance by other connection pins 12b. Therefore, the internal circuit (not shown in FIG. 1) connected with connection pins 12b do not suffer breakdown, even if any high electrostatic voltage is applied to non-connection pins 12a, because the electromotive force induced on connection pins 12b is in fact negligible, even when a high electrostatic voltage is applied to non-connection pins 12a.

Figure 2:
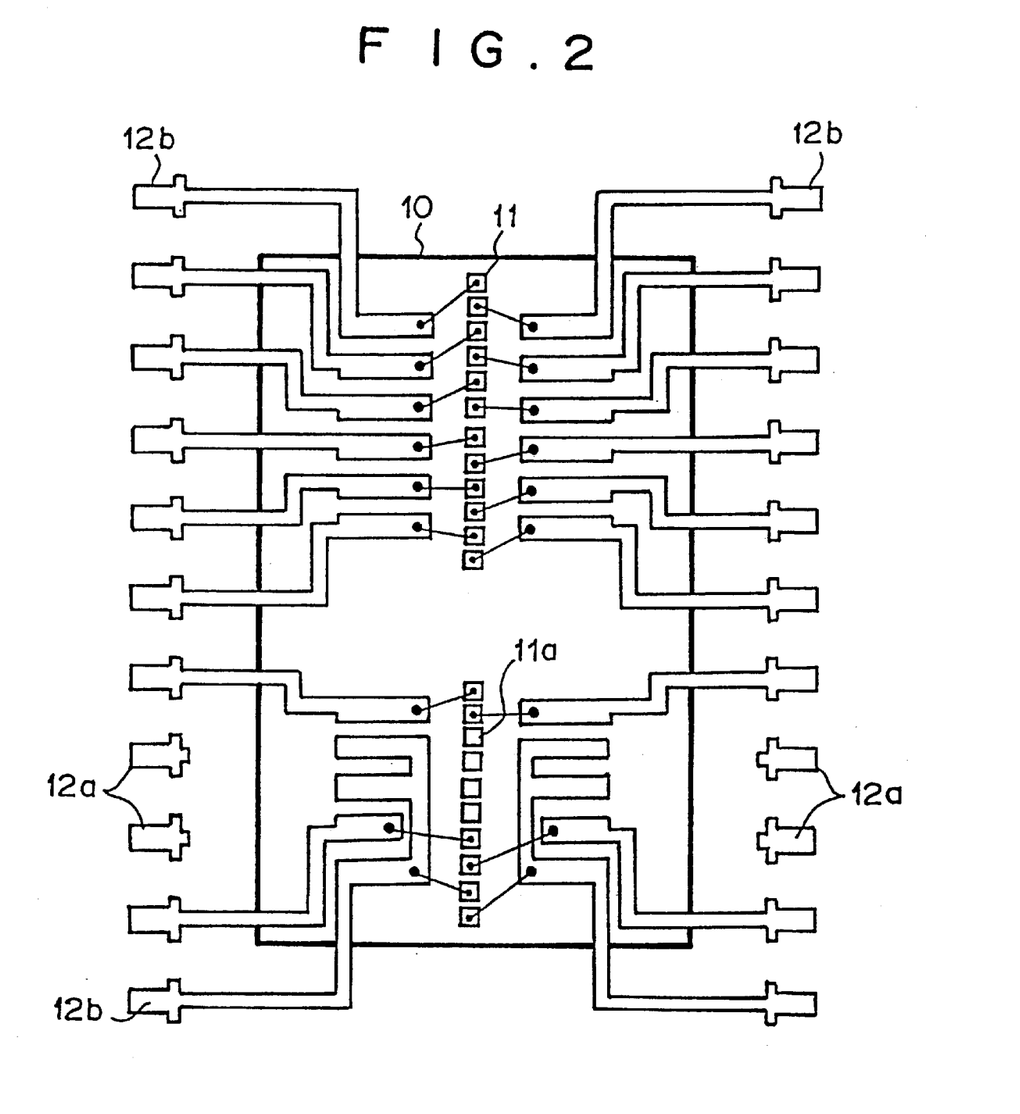
FIG. 2 is a plan view of a different arrangement of non-connection pins.

A different arrangement of non-connection pins 12b as shown in FIG. 2 is a variation of the semiconductor device as shown in FIG. 1. The two connection pins 12b in the lowest position in FIG. 2 have branch portions which are extending to the vicinity of bonding option 11a to comply with various connections required by the users.

The effect of the high voltage applied to non-connection pins 12a upon the other pins can be prevented by varying greatly the inductances of non-connection pins 12a and connection pins 12b in FIGS. 1 and 2.

Figure 3:
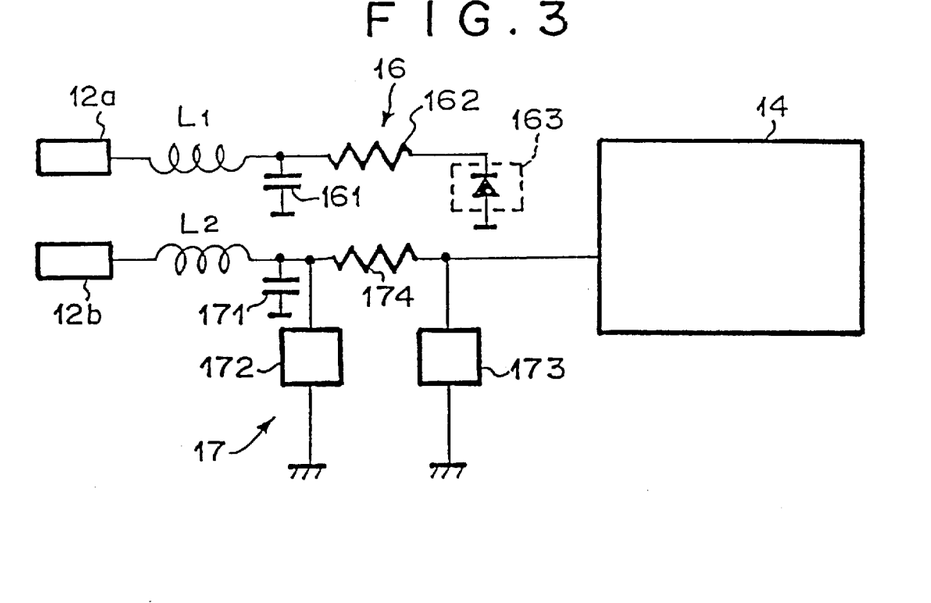
FIG. 3 is a block diagram of the semiconductor device in another embodiment of the present invention.

The semiconductor device in another embodiment of the present invention as shown in FIG. 3 comprises non-connection pin 12a and connection pin 12b, both of whose edges are extended and bonded on a semiconductor chip. Accordingly, non-connection pin 12a and connection pin 12b have the inductance L1 and L2, respectively as shown in FIG. 3. Further, non-connection pin 12a is connected with first protection circuit 16, while connection pin 12b is connected with internal circuit through second protection circuit 17.

First protection circuit 16 comprises capacitor 161, resistor 162, and diode 163 as a clamping element, while second protection circuit 17 comprises resistor 174, first clamping circuit 172 and second clamping circuit 173, each of which is connected with each end of resistor 174. First clamping circuit 172 and second clamping circuit 173 are usually composed of diodes, bipolar devices, or MOS transistors.

Capacitor 171 stands for a parasitic capacitance.

Here, the clamping capability of diode 163 is made smaller than that of clamping circuits 172 and 173, whereby the electromotive force induced by non-connection pin 12a on connection pin 12b is reduced. Further, the resistance of resistor 162 is greater than the resistance of resistor 174, whereby the time derivative of the current flowing in non-connection pin 12a is reduced.

Figure 4:
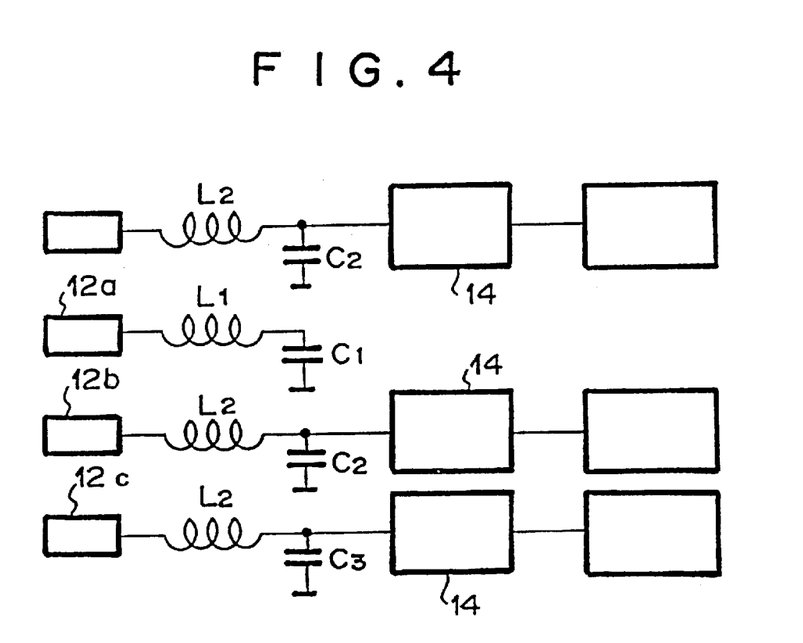
FIG. 4 is a block diagram of the semiconductor device in still another embodiment of the present invention.

The semiconductor device in still another embodiment of the present invention as shown in FIG. 4 comprises non-connection pin 12a and connection pins 12b and 12c. Each connection pins 12b and 12c is connected with each internal circuit 14. Also in this case, non-connection pin 12a has inductance L1 and connection pins 12b and 12c have inductance L2.

Preferably, the capacitance of capacitor C3 is made greater than that of capacitor C1 and smaller than that of capacitor C2. Here, capacitors C1, C2 and C3 stand for parasitic capacitance.

In the semiconductor device as shown in FIG. 4, the charge and discharge in capacitor C2 is made slow, as compared to those in capacitor C3. Therefore, the effect of the induction from non-connection pin 12a upon connection pins 12b and 12c becomes small.

Thus, the capacitance of capacitor C2 is made different from that of capacitor C3 so that the electromotive force induced by non-connection pin 12a upon connection pins 12b and 12c is reduced.

Figure 5A:
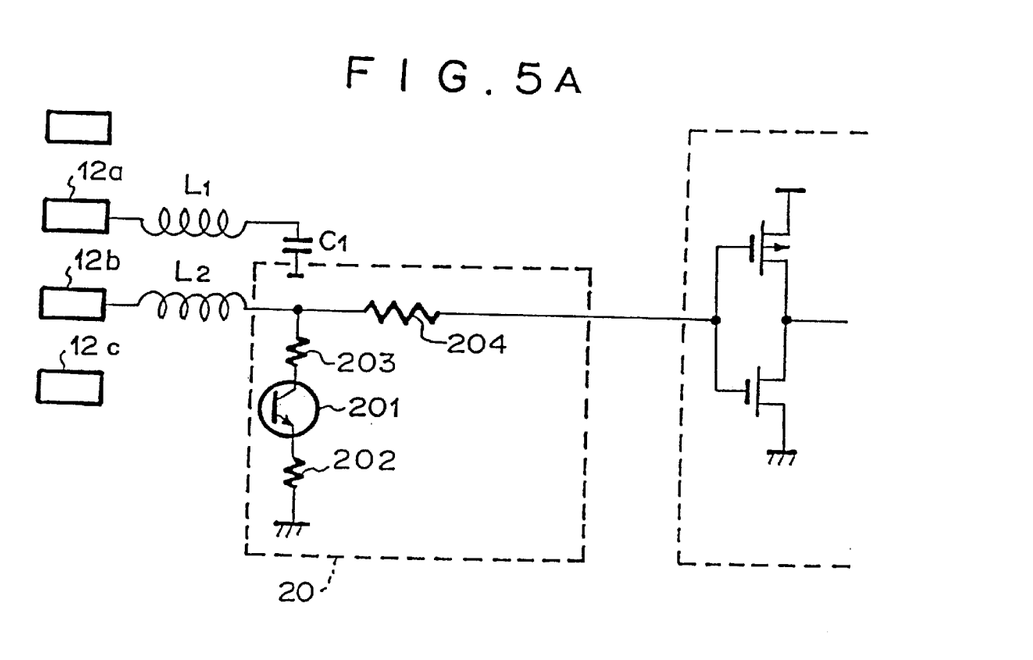
FIG. 5A is a circuit diagram of the semiconductor device in a still further embodiment of the present invention.

The semiconductor device in still another embodiment of the present invention as shown in FIG. 5A comprises non-connection pin 12a and connection pins 12b and 12c. The end of connection pin 12a is connected with inductance L1 and capacitance C1 from the point of view of an equivalent circuit, while connection pin 12b is connected through inductance L2 with clamping circuit 20 which is of greater clamping capacity than that connected with another pin adjacent to the connection pin. In this embodiment, the effect of the electromotive force induced by non-connection pin 12a is reduced by increasing the resistive voltage of connection pin 12b against the electrostatic discharge.

Clamping circuit 20 as shown in FIG. 5A comprises lateral NPN bipolar transistor 201, resistors 202 and 203 which are connected with the emitter and the collector of transistor 201, respectively, and resistor 204 connected with resistor 203. Here, the clamping capability of transistor 201 is determined by the length and width of its channel.

The clamping capacity is improved by shortening the channel length and by widening the channel width of transistor 201 in clamping circuit 20. Such an adjustment of the length and width of the channel makes it possible to suppress the effect of the induction from non-connection pin 12a, even when the electrostatic voltage applied to non-connection pin 12a is around 400 volts.

Figure 5B:
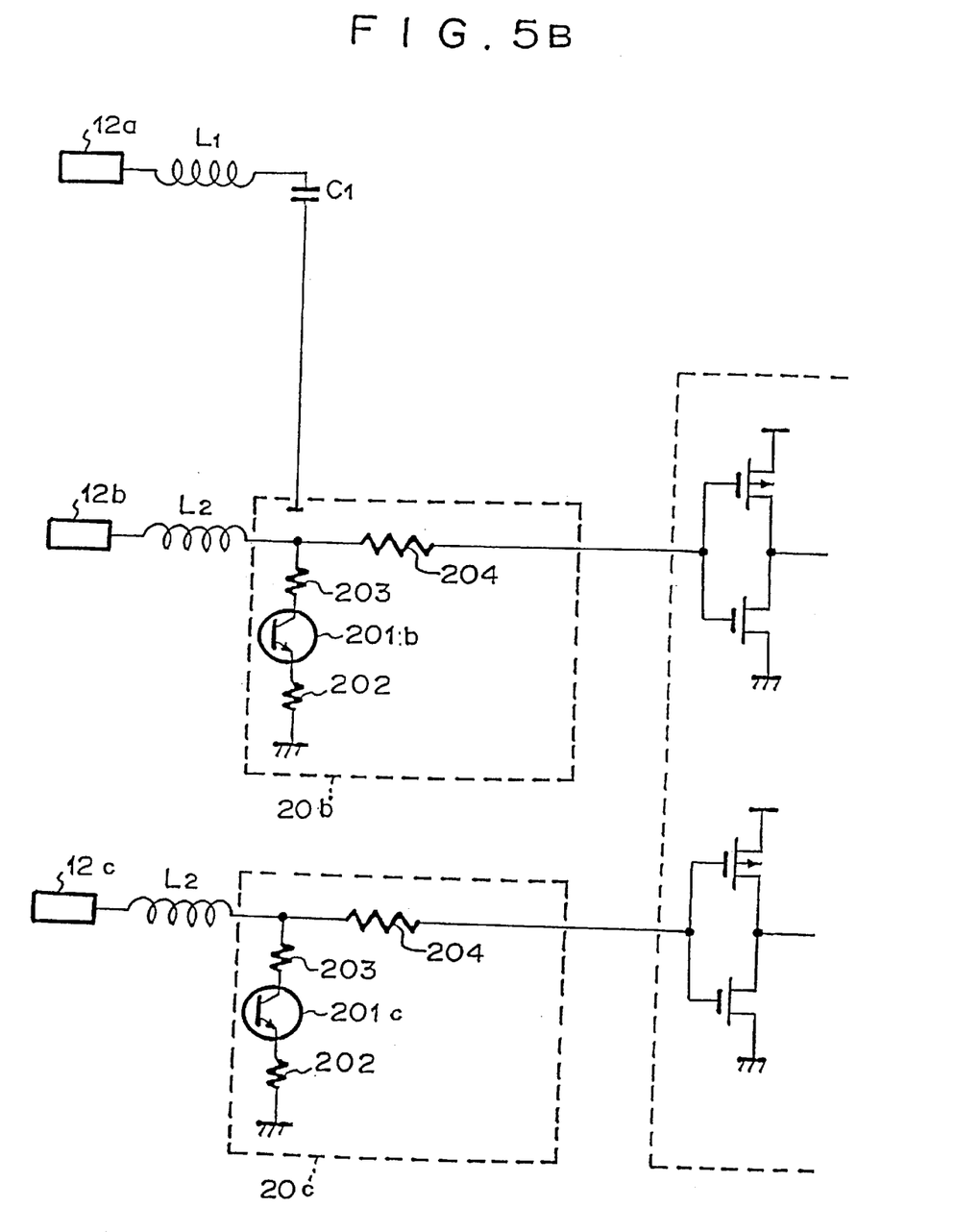
FIG. 5B is a circuit diagram of the clamping circuit as shown in FIG. 5A.

As shown in FIG. 5B, second clamping circuit 20b and third clamping circuit 20c include second lateral bipolar transistor 201b and third lateral bipolar transistor 201c, respectively, and the channel width of second lateral bipolar transistor 201b is greater than that of third lateral bipolar transistor 201c.

Similarly, MOS transistors may be employed in place of above-mentioned lateral bipolar transistors.

Figure 6:
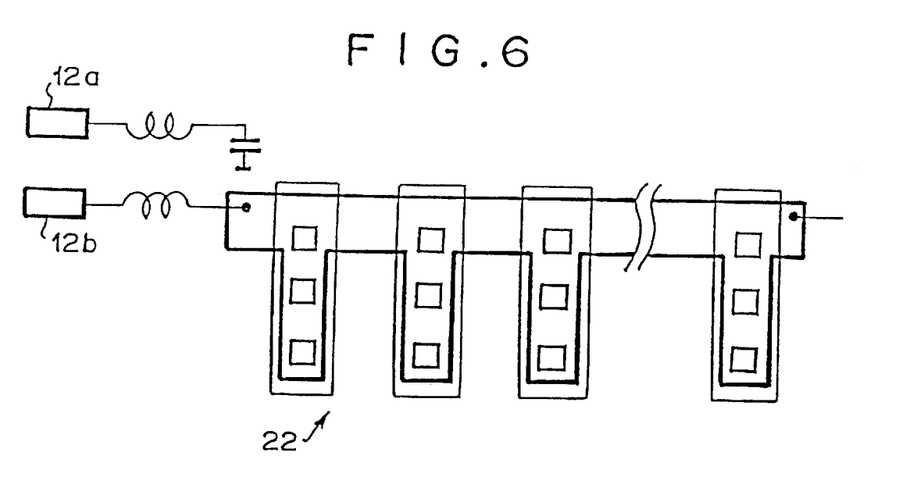
FIG. 6 is a block diagram of the semiconductor device in a still further embodiment of the present invention with a cascade of clamping circuits.

A cascade connection of a plurality of clamping circuits 20 as shown in FIG. 6 may be used to improve further the clamping capability of diode.

A clamping circuit 22 as shown in FIG. 6 comprises a plurality of diodes each of which is formed of impurity diffused region on a semiconductor substrate. The clamping capability of each diode depends on the area of the PN junction and is improved by enlarging the area.

Different materials may be used for non-connection pin 12a and connection pin 12b to reduce the mutual inductance.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor device, comprising:
   first protection circuit connected with a non-connection pin, and
   a second protection circuit connected with a connection pin,
   wherein a protection characteristic of said first protection circuit is different from a protection characteristic of said second protection circuit, and wherein an internal circuit connected to said connection pin adjacent to said non-connection pin is protected when an abnormal voltage is applied to said non-connection pin.

2. The semiconductor device according to claim 1, wherein said first protection circuit suppresses the rise-up of voltage of the second protection circuit.

3. The semiconductor device according to claim 2, wherein said first protection circuit suppresses the rise-up of voltage of the second protection circuit due to the mutual inductance between said non-connection pin and said connection pin.

4. The semiconductor device according to claim 2, wherein said first protection circuit includes at least one resistor for suppressing said rise-up of voltage.

5. The semiconductor device according to claim 1, wherein said first protection circuit includes a first clamping circuit;
   said second protection circuit includes a second clamping circuit; and
   clamping capability of said first clamping circuit is smaller than that of said second clamping circuit.

6. The semiconductor device according to claim 1, wherein said first protection circuit includes a first resistor;
   said second protection circuit includes a second resistor; and
   resistance of said first resistor is greater than that of said second resistor.

7. The semiconductor device according to claim 1, wherein materials for said non-connection pin are different from those for said connection pin.

8. The semiconductor device according to claim 7, wherein the mutual inductance between said non-connection pin and said connection pin is reduced.

9. The semiconductor device according to claim 1, wherein a lead connected to said non-connection pin is shorter than a lead connected to said connection pin.

10. The semiconductor device according to claim 7, wherein an internal loss of a lead for said non-connection pin is different from that for said connection pin.

11. A semiconductor device that is one of a lead on chip (LOC) and a chip on lead (COL) semiconductor device, the device comprising:
    a semiconductor chip having a plurality of bonding pads thereupon;
    a non-connection pin free of connection to any of said plurality of bonding pads;
    a first connection pin adjacent to said non-connection pin for receiving a first input signal; and
    a second connection pin adjacent to said first connection pin for receiving a second input signal,
    wherein a protection characteristic of a first protection circuit connected between said first connection pin and a potential is different from a protection characteristic of a second protection circuit connected between said second connection pin and the potential so that an internal circuit of said semiconductor chip connected to said first connection pin through an associated one of said plurality of bonding pads is protected against an electrostatic breakdown when an abnormal voltage is applied to said non-connection pin.

12. The semiconductor device according to claim 11, wherein a capacitance of said first connection pin is different from a capacitance of said second connection pin.

13. The semiconductor device according to claim 11, wherein a voltage clamping capability of said first protection circuit is greater than a voltage clamping capability of said second protection circuit.

14. The semiconductor device according to claim 13, wherein said first protection circuit and said second protection circuit include a first MOS transistor and a second MOS transistor, respectively; and
   a channel width of said first MOS transistor is greater than a channel width of said second MOS transistor.

15. The semiconductor device according to claim 13, wherein said first protection circuit and said second protection circuit include a first lateral bipolar transistor and a second lateral bipolar transistor, respectively; and
   a channel width of said first lateral bipolar transistor is greater than a channel width of said second lateral bipolar transistor.

16. A semiconductor device that is one of a lead on chip (LOC) and a chin on lead (COL) device, the device comprising:
   a plurality of connection pins and a plurality of non-connection pins adjacent to said plurality of connection pins, wherein corresponding leads for said plurality of non-connection pins are shorter than associated leads for said plurality of connection pins,
   said corresponding leads for said non-connection pins being located entirely outside an area defined by a boundary of the semiconductor device.

17. The semiconductor device according to claim 16, wherein the semiconductor device is a LOC device and a length of said corresponding leads for each of said non-connection pins is such that an electromotive force on said plurality of connection pins induced by a mutual inductance between said plurality of connection pins and said plurality of non-connection pins is lower than a smallest value of a breakdown voltage of a plurality of circuits connected with said plurality of connection pins.

18. The semiconductor device of claim 11, further comprising a protective circuit connected between said non-connection pin and the potential.

19. The semiconductor device of claim 18, wherein said protective circuit comprises a capacitor.

20. The semiconductor device of claim 11, wherein said first protection circuit comprises a first capacitor and said second protection circuit comprises a second capacitor,
   said first capacitor having a capacitance value greater than a capacitance value of said second capacitor.

21. The semiconductor device of claim 20, further comprising a third protection circuit having a third capacitor connected between said non-connection pin and the potential,
   said third capacitor having a capacitance value less than the capacitance values of both said first and second capacitors.

22. A semiconductor device, the device comprising:
   a semiconductor chip having a plurality of internal circuits connected directly to associated ones of a plurality of bonding pads located on said semiconductor chip;
   a plurality of pins located in an area outside an area defined by said semiconductor chip,
   each of said plurality of pins being one of a connected pin and a non-connected pin,
   at least one of said plurality of pins being a non-connected pin free of connection to any of said plurality of bonding pads,
   at least one of said plurality of pins being a connected pin for receiving an input signal and being connected by a lead to a corresponding one of said plurality of bonding pads;
   a first protection circuit connected between said at least one non-connected pin and a potential;
   a second protection circuit connected between said at least one connected pin and the potential,
   said first and second protection circuits comprising respective first and second protecting means for controlling an amplitude of an abnormal voltage coupled from said at least one non-connected pin onto said at least one connected pin to preclude an uncontrolled voltage from being applied to the associated one of the plurality of internal circuits of the semiconductor device,
   wherein a shape of said at least one connected pin is different than a shape of said at least one non-connected pin.

23. The semiconductor device of claim 22, wherein said first protecting means comprises a first resistor and a first clamping element, and said second protecting means comprises a first clamping circuit, a second resistor, and a second clamping circuit,
   said first and second protecting means being operatively connected between said at least one non-connection pin and said at least one connected pin to reduce the magnitude of the abnormal voltage coupled onto said at least one connected pin,
   the magnitude of the abnormal voltage on said at least one connected pin being reduced to a level less than a breakdown voltage of an associated one of said plurality of internal circuits.

24. The semiconductor device of claim 22, wherein said first protecting means comprises a first inductance and a first capacitance, and said second protecting means comprises a second inductance and a second capacitance,
   said first inductance and said second inductance being arranged to have a mutual inductance which couples the abnormal voltage from said at least one non-connected pin onto said at least one connected pin,
   said second capacitance being larger than said first capacitance for setting a time constant of said second protection circuit to be longer than a time constant of said first protection circuit,
   the time constant of said second protection circuit being selected to reduce the level of the abnormal voltage coupled from said at least one non-connected pin onto said at least one connected pin.

25. The semiconductor device of claim 22, wherein said second protecting means comprises a first transistor connected between said at least one connected pin and the potential,
   said first transistor being operatively connected so as to clamp a voltage amplitude of the abnormal voltage coupled from said at least one non-connected pin onto said at least one connected pin at a predetermined level less than the breakdown voltage of an associated one of said plurality of internal circuits.

26. The semiconductor device of claim 25, further comprising:
   at least two connected pins for receiving first and second input signals,
   said at least two connected pins being connected to associated ones of said plurality of internal circuits; and
   a third protection circuit comprising a second transistor connected between a second one of said at least two connected pins and the potential,
   said second transistor being operatively connected so as to clamp a voltage amplitude of an abnormal voltage coupled from a first one of said at least two connected pins onto said second one of said at least two connected pins at a predetermined level less than the breakdown voltage of a second associated one of said plurality of internal circuits.

27. The semiconductor device of claim 1, wherein a shape of said connection pin is different than a shape of said non-connection pin.

* * * * *